United States Patent [19]

Koike et al.

[11] Patent Number: 4,596,755
[45] Date of Patent: Jun. 24, 1986

[54] PHOTORESIST COMPOSITION WITH AZIDE HAVING ALKOXY SILANE AS ADHESION AGENT FOR GLASS SUBSTRATE

[75] Inventors: Norio Koike, Fukaya; Hatsuo Tsukagoshi, Yabuzuka-honmachi, both of Japan

[73] Assignee: Kabushiki Kaisha Toshiba, Kawasaki, Japan

[21] Appl. No.: 690,988

[22] Filed: Jan. 14, 1985

[30] Foreign Application Priority Data

Jan. 12, 1984 [JP] Japan ................................. 59/2614

[51] Int. Cl.$^4$ .......................... G03C 1/71; G03C 1/60
[52] U.S. Cl. ...................................... 430/196; 430/28; 430/167; 430/272
[58] Field of Search ................... 430/196, 167, 28, 272

[56] References Cited

U.S. PATENT DOCUMENTS

| | | |
|---|---|---|
| 3,549,368 | 12/1970 | Collins et al. .................. 430/167 |
| 3,586,554 | 6/1971 | Couture et al. ................. 430/319 |
| 3,702,766 | 11/1972 | Dunham et al. ................ 430/196 |
| 3,758,306 | 9/1973 | Roos ............................... 430/260 |
| 3,909,265 | 9/1975 | Miyano et al. .................. 430/167 |
| 3,945,830 | 3/1976 | Yazowa et al. ................. 430/196 |
| 3,953,212 | 4/1976 | Miyano et al. .................. 430/196 |
| 4,099,973 | 7/1978 | Miura et al. .................... 430/167 |
| 4,491,629 | 1/1985 | Koike et al. ..................... 430/28 |

FOREIGN PATENT DOCUMENTS

| | | |
|---|---|---|
| 2303671 | 9/1973 | Fed. Rep. of Germany . |
| 51-19982 | 6/1976 | Japan . |
| 58-143340 | 8/1983 | Japan . |
| 1376114 | 12/1974 | United Kingdom . |

Primary Examiner—Charles L. Bowers, Jr.
Attorney, Agent, or Firm—Oblon, Fisher, Spivak, McClelland & Maier

[57] ABSTRACT

A photoresist composition, comprising, a water-soluble azide compound and a water-soluble polymer in combination with a water-soluble silane compound having at least two alkoxysilane groups.

8 Claims, No Drawings

PHOTORESIST COMPOSITION WITH AZIDE HAVING ALKOXY SILANE AS ADHESION AGENT FOR GLASS SUBSTRATE

BACKGROUND OF THE INVENTION

1. Field of the Invention

This invention relates to a photoresist composition and, more particularly, relates to a photoresist composition having improved adhesion to a substrate.

2. Description of the Prior Art:

Photoresist compositions are widely used for plate making and photoetching and must have the following characteristics: (a) high resolution, (b) high sensitivity, (c) stability quality upon preservation, (d) a sufficiently hard photoresist layer to resist corrosion and abrasion, and (e) strong adhesion to substrates. The photoresists further must have a wide latitude in developing, while both the photoresist itself and its developing solution should not give rise to environmental pollution problems.

Conventionally a dichromate series photoresist made of a mixture of dichromate and a water-soluble polymer, for example glue, gelatin, albumin (egg white) and polyvinyl alcohol, is widely used for plate making and photoetching. Dichromate, i.e., $Cr_2O_7^{2-}$, is used to harden the polymer. The reason this composition is used is that this photoresist is cheap and approximately meets the above-mentioned criteria (a), (b), (d) and (e). However, this type of photoresist gradually changes in quality by a natural reaction, the so-called "dark reaction", even though it is normally stored in the dark, and the photoresist becomes unusable. Further, the use of chromium in the composition as a cross-linking agent raises problems, upon disposal, of environmental pollution.

To resolve the above-mentioned drawbacks, a proposal which has been advanced is to make a photoresist composition by introducing a photosensitive radical into the polymeric material itself or by mixing an organic photosensitive agent with a polymeric material. One of these attempts has been the formulation of a photoresist comprising a water-soluble polymer mixed with a light-sensitive organic crosslinking agent instead of dichromate. (See Japanese Patent Publication No. 48,946/1976). An example of the formulation is a photoresist composition comprising a water-soluble bisazide compound which has a hydrophilic radical such as 4,4'-bisazidostilbene-2,2'-disulfonic acid or its salt, and a water-soluble polymer such as polyacrylamide, polyvinylpyrrolidone or gelatin. This bisazide photoresist varies in its characteristics according to the characteristics of the water-soluble polymer with which it is combined. This photoresist approximately meets the above-mentioned criteria (a), (b), (c) and (e). However, this type of photoresist generally weakly adheres to the substrate. Weak adhesion causes low resolution.

Generally, a bisazide photoresist more weakly adheres to a substrate than a dichromate photoresist. The reason for this is unclear. However, it is believed that in a dichromate photoresist a chromium ion acts as a connector for joining the polymer component to the substrate. On the contrary, a bisazide photoresist has no such similar function.

In order to obviate the above-stated problems of biasazide photoresists, methods of improving the adhesion of such photoresists have been proposed. Japanese Patent Publication No. 19,982/1976 discloses a photoresist composition comprising a bisazide compound, a suitable water-soluble polymer and at least one silane compound selected from the group of γ-aminopropyltriethoxysilane, N-(β-aminoethyl)-γ-aminopropylmethyldimethoxysilane and N-(β-aminoethyl)-γ-aminopropyltrimethoxysilane as an adhesive activator. However, the silane compounds do not impart adequate increased adhesion of the bisazide photoresist to a substrate, because these silane compounds have only one alkoxysilane group. A need therefore continues to exist for a method of improving the substrate binding characteristics of bisazide photoresist formulations.

SUMMARY OF THE INVENTION

Accordingly, one object of the present invention is to provide a photoresist composition which has excellent adhesion to a substrate.

Another object of the present invention is to provide a photoresist composition having good resolution and high sensitivity.

Yet another object of the present invention is to provide a photoresist composition which is capable of forming a strong layer.

Still a further object of the present invention is to provide a photoresist composition which is virtually pollution free and which has good stability which enables preservation of the composition.

Briefly, this object and other objects of the present invention as hereinafter will become more readily apparent can be attained by a photoresist composition comprising a water-soluble azide compound and a water-soluble polymer in combination with a water-soluble silane compound having at least two alkoxysilane groups.

DETAILED DESCRIPTION OF THE PREFERRED EMBODIMENTS

A known photoresist composition, as disclosed in, for example, Japanese Patent Publication No. 9,982/1976 and its corresponding British Pat. No. 1,376,114, contains a water-soluble silane compound which has only one alkoxysilane group such as γ-aminopropyltriethoxysilane, N-(β-aminoethyl)-β-aminopropylmethyldimethoxysilane and N-(β-aminoethyl)-γ-aminopropyltrimethoxysilane. The silane ingredient is an adhesion promoting material. On the contrary, the water-soluble silane compound of the invention has at least two alkoxysilane groups in the molecule, the silicon atoms of the compound being of the formula:

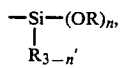

wherein n is 2 or 3, and R and R' each represent alkylene groups containing one to 10 carbon atoms. The photoresist composition of the present invention which contains such alkoxysilane groups excellently adhere to a substrate.

In the past it has been believed that the mechanism of adhesion between a silane compound and the surface of a glass substrate results from the covalent bonding between silanol groups at one end of the silane molecule, which are present as the result of hydrolysis of the alkoxysilane molecule, and hydroxyl groups on the surface of the substrate. However, it has now been discovered that when a conventional silane compound is used which has only one alkoxysilane group, the film of photoresist which is formed is not continuously formed on the substrate because the film is repelled by water produced by the reaction between the silane ingredient and hydroxyl groups on the surface of the substrate (Repelled Phenomenon). In the work leading to the present invention, many kinds of silane compounds have been investigated and as a result, it has been found that silane compounds which have at least two alkoxysilane groups are effective in photoresist compositions by promoting excellent adhesion of the photoresist to the substrate. When the photoresist composition of the invention is used, it is assumed that a hydrophobic polymer layer of silicone is produced between the surface of the substrate and the polymer layer of the photoresist composition, and that the hydrophobic silicone layer stably adheres to the polymer layers of the photoresist and prevents water molecules from attacking the boundary of the substrate and the photoresist, thus improving the adhesion of the photoresist to the substrate. It is also assumed that the hydrophobic layer is produced by molecular polycondensation of silane molecules. In order to produce the hydrophobic silicone layer effectively, it is important to use a silane compound having at least two alkoxysilane groups.

Suitable water-soluble bisazide compounds which are used in the present invention include, for example, 4,4'-bisazidostilbene -2,2'-disulfonic acid; 4,4'-disazidobenzalacetophenone-2-sulfonic acid; 4,4'-bisazidostilbene-α-carboxylic acid and their salts as described in Japanese Patent Publication No. 48,946/1976.

Suitable water-soluble polymers which may be used in the present invention include, for example, synthetic polymers such as polyvinyl alcohol, polyvinylpyrrolidone, polyacrylamide, polyvinylmethylether, polyvinylacetal, polyacryl acid and the like; natural polymers such as gelatin, shellac, gum arabic casein and the like; copolymers such as a copolymer of maleic acid and vinylmethylether, a copolymer of acrylamide and diacetoneacrylamide and a copolymer of an acrylamide and vinyl alcohol and the like; graft copolymerized polymers such as acrylonitrile graft copolymerized with polyvinyl alcohol, glycidyl methacrylate graft copolymerized with polyvinyl alcohol and β-oxyethylmethacrylate graft polymerized with polyvinyl alcohol and the like; and a semisynthetic polymer such as carboxymethylcellulose, hydroxymethylcellulose, hydroxypropylcellulose and poly-L-sodium glutamate. At least one of these water-soluble polymers is required to cross-link with the water-soluble bisazide compound by ultraviolet rays.

Furthermore, the present formulation may also contain a small amount of surface active agent such as, for example, polyethylene glycol, phenoxypolyethyleneoxide phosphoric ester and sodium hexametaphosphate; or a small amount of an alcohol such as, for example, ethyl alcohol, glycerin, ethyleneglycol, sorbitol and tert-butyl alcohol which is useful for improving the foam breaking and film-forming properties of the formulation.

The water-soluble silane compound ingredient of the present formulation which has at least two alkoxysilane groups includes such silane compounds as: $(CH_3O)_3SiC_3H_6NHC_2H_4NHC_3H_6Si(OCH_3)_3$, and $(C_2H_5O)_3SiC_3H_6NHC_2H_4NHC_3H_6Si(OC_2H_5)_3$.

These compounds may be used solely or in mixtures. For the photoresist formulation of the invention, the amount of the silane compound ranges from 0.0001 to 20 parts by weight per 100 parts by weight of the water-soluble polymer, preferably, 0.01 to 10 parts by weight per 100 parts by weight of the water-soluble polymer. This amount of silane compound is sufficient to improve adhesion.

Since the photoresist composition of the present invention includes the silane compound having at least two alkoxysilane groups, the "Repelled Phenomenon" between the substrate and the photoresist layer is prevented and thus a photoresist layer having a sufficient degree of adhesion to a substrate may be obtained in comparison to conventional photoresist compositions which contain a silane compound which has only one alkoxysilane group. In addition, the silane compound of the present invention is safe because it does not present pollution problems. Further, the silane compound having at least three alkoxysilane groups is preferred for adhesion of the photoresist layer because the hydrophobic polymer layer may be easily produced.

Having generally described this invention, a further understanding can be obtained by reference to certain specific examples which are provided herein for purposes of illustration only and are not intended to be limiting unless otherwise specified.

A 100 part by weight amount of polyvinylpyrrolidone and 5 parts by weight of 4,4'-bisazidostilbene-2,2'-sodium disulfonate are dissolved in 5000 parts by weight of water to form a stock solution. Four different water-soluble silane compounds in 0.1 parts by weight amounts as shown in the table below, are added to given sampling prepared stock solution resulting in four photoresist compositions. A fifth composition is prepared which contains no silane compound. Each photoresist composition is coated on a glass substrate of 100 mm×100 mm, and then dried. Next, a mask having apertures of 0.35 mm in diameter, which apertures are arranged in two dimensions in 0.6 mm pitch, is contacted with the photoresist coated substrate. Each photoresist layer is exposed to light from a super high pressure mercury lamp of 500 watts for one minute. The thus exposed products are developed under the conditions shown as follows in order to ascertain the adhesion of each photoresist layer to the substrate.

| | |
|---|---|
| Water Pressure | 2.0 kg/cm$^2$ |
| Temperature of Liquid | 40 to 41° C. |
| Distance between the Nozzle and the Substrate | 300 mm |
| Diameter of Nozzle | 1.0 mm |
| Developing Time | 20 seconds |

The number of dots of hardened photoresist per unit area which remain upon peeling of the photoresist layer are counted and the results are shown in the table.

| Sample | Number of Alkoxysilane Groups | Formula of Water-Soluble Silane Compound | Number of Peeled Dots |
|---|---|---|---|
| 1 | 2 | $(CH_3O)_3SiC_3H_6NHC_2H_4NHC_3H_6Si(OCH_3)_3$ | 0 |

| Sample | Number of Alkoxysilane Groups | Formula of Water-Soluble Silane Compound | Number of Peeled Dots |
| --- | --- | --- | --- |
| 2 | 2 | $(C_2H_5O)_3SiC_3H_6NHC_2H_4NHC_3H_6Si(OC_2H_5)_3$ | 0 |
| 3 | — | — | 30 |
| 4 | 1 | $H_2NCH_2CH_2NHCH_2CH_2CH_2Si(OCH_3)_3$ | 12 |
| 5 | 1 | $H_2NCH_2CH_2CH_2Si(OCH_3)_3$ | 23 |

Each of the photoresist compositions of samples 1 and 2 has good resolution of about 20 um and the resulting hardened layer is satisfactory from the viewpoint of corrosion resistance and durability for practical use. These photoresist compositions are quite storage stable and scarcely change in quality in the dark at room temperature over a one month period.

In order to prepare another kind of photoresist composition, 50 parts by weight of polyacrylamide, 50 parts by weight of polyvinylpyrrolidone, and 15 parts by weight of P-azidobenzalacetophenone-2-sodium sulfonate are dissolved in 6000 parts by weight of water to form a stock solution. A series of four solutions is prepared by adding one of the water-soluble silane compounds shown in the table above to given volumes of the prepared stock solution. A fifth solution with no silane compound is also prepared. The photoresist compositions are evaluated in the same manner as described above. The results obtained show that the photoresist formulations which contain the alkoxysilane compounds of samples 1 and 2 exhibit good adhesion to the substrates.

As discussed above, the photoresist composition of the present invention has several advantages, which are: (a) high adhesion to the substrate, (b) high sensitivity, (c) high resolution, (d) the capability of forming a corrosion resistant layer which is durable, (e) stable in quality, and (f) the presentation of virtually no pollution problems. As such the present composition is useful for plate making and for photo etching.

Having now fully described this invention, it will be apparent to one of ordinary skill in the art that many changes and modifications can be made thereto without departing from the spirit or scope of the invention as set forth herein.

What is claimed as new and desired to be secured by Letters Patent of the United States is:

1. A photoresist composition for coating on a glass substrate, comprising:
an admixture of a cross-linking amount of a water-soluble, photosensitive azide compound, a film-forming amount of a water-soluble polymer, and an adhesion-activating amount of a water-soluble silane compound having at least two alkoxysilane groups of the formula:

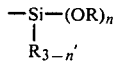

wherein R and R' are each independently an alkylene group containing 1 to 10 carbon atoms and n is 2 or 3.

2. The photoresist composition according to claim 1, wherein said water-soluble silane compound is at least one compound selected from the group consisting of $(CH_3O)_3SiC_3H_6NHC_2H_4NHC_3H_6Si(OCH_3)_3$, and $(C_2H_5O)_3SiC_3H_6NHC_2H_4NHC_3H_6Si(OC_2H_5)_3$.

3. The photoresist composition according to claim 1, wherein said water soluble, photosensitive azide compound is 4,4'-bisazidostilbene-2,2'-disulfonic acid, 4,4'-biazidobenzalacetophenone-2-sulfonic acid, 4,4'-bisazidostilbene-α-carboxylic acid or salts thereof.

4. The photoresist composition according to claim 1, which further comprises a surface active agent.

5. The photoresist composition according to claim 1, wherein said composition contains from 0.0001 to 20 parts by weight of said silane compound per 100 parts by weight of the water soluble polymer.

6. The photoresist composition according to claim 5, wherein the amount of said silane compound ranges from 0.01 to 10 parts by weight.

7. The photoresist composition according to claim 1, wherein said water-soluble polymer is polyvinyl alcohol, polyvinylpyrrolidone, polyacrylamide, polyvinylmethylether, polyvinyl acetal, polyacryl acid, a natural polymer, a copolymer of maleic acid and vinyl methylether, a copolymer of acrylamide and diacetoneacrylamide, a copolymer of acrylamide and vinyl alcohol, a graft copolymerized polymer of a semisynthetic polymer.

8. The photoresist composition according to claim 1, which further comprises an alcohol.

* * * * *